United States Patent
Yang

(10) Patent No.: US 8,767,503 B2
(45) Date of Patent: Jul. 1, 2014

(54) CLOCK TRANSFER CIRCUIT AND SEMICONDUCTOR DEVICE INCLUDING THE SAME

(75) Inventor: Sun-Suk Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 222 days.

(21) Appl. No.: 13/333,989

(22) Filed: Dec. 21, 2011

(65) Prior Publication Data

US 2013/0111255 A1    May 2, 2013

(30) Foreign Application Priority Data

Oct. 27, 2011   (KR) .................. 10-2011-0110519

(51) Int. Cl.
*G11C 8/00*   (2006.01)

(52) U.S. Cl.
USPC .............. 365/233.1; 365/233.11; 365/233.12; 365/233.13; 365/203

(58) Field of Classification Search
USPC ........ 365/233.1, 233.11, 233.12, 233.13, 203
See application file for complete search history.

(56) References Cited

U.S. PATENT DOCUMENTS

| | | | |
|---|---|---|---|
| 6,414,887 B2 * | 7/2002 | Koshikawa | 365/200 |
| 6,563,760 B2 * | 5/2003 | Song | 365/233.11 |
| 7,672,191 B2 * | 3/2010 | Jang | 365/233.12 |

* cited by examiner

*Primary Examiner* — Son Dinh
(74) *Attorney, Agent, or Firm* — IP & T Group LLP

(57) ABSTRACT

A clock transfer circuit includes a clock transfer unit configured to receive an external clock and transfer the received external clock as one or more internal clocks and a clock control unit configured to control the clock transfer unit to transfer the external clock as a column clock among the internal clocks in response to an active command and block a transfer of the external clock as the column clock in response to a precharge command.

16 Claims, 3 Drawing Sheets

CLOCK TRANSFER CIRCUIT AND SEMICONDUCTOR DEVICE INCLUDING THE SAME

CROSS-REFERENCE TO RELATED APPLICATIONS

The present application claims priority of Korean Patent Application No. 10-2011-0110519, filed on Oct. 27, 2011, which is incorporated herein by reference in its entirety.

BACKGROUND

1. Field

Exemplary embodiments of the present invention relate to a clock transfer circuit, and more particularly, to a semiconductor device including the clock transfer circuit.

2. Description of the Related Art

Generally, synchronous semiconductor devices including semiconductor memory devices performs a data read operation and a data write operation in synchronization with an internal clock that is generated based on an external clock. The examples of the synchronous semiconductor devices include a Single Data Rate (SDR) Synchronous Dynamic Random Access Memory (SDRAM) device, which outputs data at rising edges of a clock signal, and a Double Data Rate (DDR) SDRAM, which outputs data at rising edges and falling edges of a clock signal.

Here, an internal clock may be supplied as a row clock and a column clock. The row clock is supplied to the circuits that perform the operations of generating and delaying signals related to row operations, such as an active operation, a precharge operation, and a refresh operation, in a semiconductor device. The column clock is supplied to the circuits that perform the operations of generating and delaying signals related to column operations, such as a write operation and a read operation, in a semiconductor device.

FIG. 1 is a block diagram of a conventional semiconductor device.

Referring to FIG. 1, the conventional semiconductor device includes a clock transfer unit 110, a row operation circuit 120, and a column operation circuit 130.

The row operation circuit 120 is a circuit that generates and delays signals related to the row operations of the semiconductor device, and the column operation circuit 130 is a circuit that generates and delays signals related to the column operations of the semiconductor device.

The clock transfer unit 110 transfers an external clock OCLK as an internal clock ICLK and supplies the internal clock ICLK to the row operation circuit 120 and the column operation circuit 130. The clock transfer unit 110 may be a typical clock buffer circuit that generates an output clock by buffering an input clock or a typical clock driver circuit that generates an output clock by driving an input clock, i.e., supplying voltages to an output node in response to an input clock.

Referring to FIG. 1, the clock transfer unit 110 supplies the same internal clock ICLK to the row operation circuit 120 and the column operation circuit 130. In short, the internal clock ICLK is supplied as the aforementioned row clock and column clock.

The column operation, however, is performed in a period from a moment when an active command for activating a word line is applied to a moment when a precharge command for precharging a bit line is applied. Therefore, the column operation circuit 130, for example, a circuit that delays a read command, a write command, and a column address, may not use a column clock except such a period from a moment when the active command is applied to a moment when the precharge command is applied. As described above, however, the conventional technology does not control the enabling period of the row clock and the enabling period of the column clock separately. Thus, the column clock is provided to the column operation circuit 130 even in a period when a column operation is not performed, thereby increasing the operation current of the semiconductor device during the column operation and furthermore increasing power consumption of the semiconductor device.

SUMMARY

Exemplary embodiments of the present invention are directed to a clock transfer circuit that may decrease the amount of operation current and reduce power consumption of a semiconductor device employing the clock transfer circuit by blocking the supply of a column clock to a circuit that performs a column operation in operation periods other than a column operation period.

In accordance with an exemplary embodiment of the present invention, a clock transfer circuit includes a clock transfer unit configured to receive an external clock and transfer the received external clock as one or more internal clocks, and a clock control unit configured to control the clock transfer unit to transfer the external clock as a column clock among the internal clocks in response to an active command and block a transfer of the external clock as the column clock in response to a precharge command.

In accordance with another exemplary embodiment of the present invention, a semiconductor device includes a clock transfer unit configured to receive an external clock and transfer the received external clock as one or more internal clocks, a clock control unit configured to control the clock transfer unit to transfer the external clock as a column clock of the internal clocks in response to an active command and block a transfer of the external clock as the column clock in response to a precharge command, and a command delay unit configured to delay a read command or a write command by using the column clock and a latency.

In accordance with yet another exemplary embodiment of the present invention, a signal transfer circuit includes a clock transfer unit configured to transfer an external clock as one or more internal clocks in response to a control signal, and a clock control unit configured to generate the control signal activated in response to an active command and deactivated in response to a precharge command.

DETAILED DESCRIPTION

Figure 1:
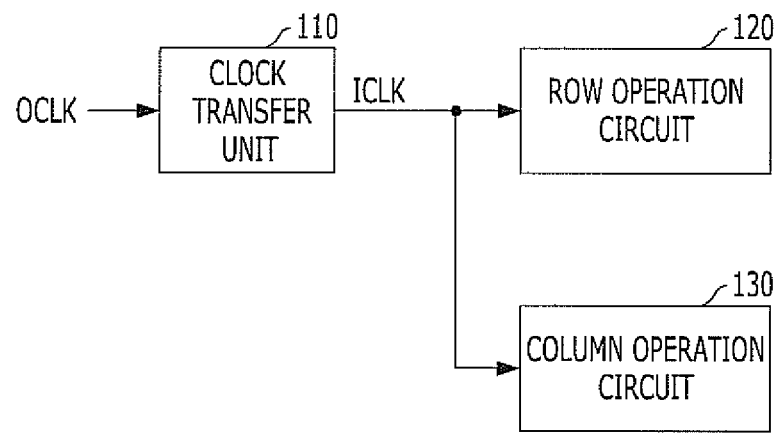
FIG. 1 is a block diagram of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, an active command ACT is a command that is applied to activate a word line. A precharge command PCG is a command that is applied to precharge a bit line. A read command RD is a command that is applied to read a data out of a memory cell. A write command WT is a command that is applied to write a data in a memory cell. A refresh command is a command applied to perform a refresh operation in order to prevent a memory cell from losing a data. The enable level or disable level of each signal may be a logic high level or a logic low level, and this may be different depending on the types of the signal or the ways of circuit designs of a semiconductor device.

Figure 2:
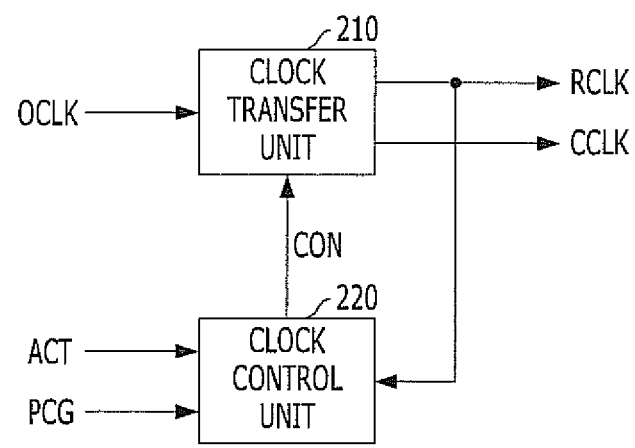
FIG. 2 is a block diagram illustrating a clock transfer circuit in accordance with an exemplary embodiment of the present invention.

FIG. 2 is a block diagram illustrating a clock transfer circuit in accordance with an exemplary embodiment of the present invention.

Referring to FIG. 2, the clock transfer circuit includes a clock transfer unit 210 and a clock control unit 220. The clock transfer unit 210 receives an external clock OCLK and outputs and transfers one or more internal clocks RCLK and CCLK. The clock control unit 220 controls the clock transfer unit 210 to transfer the external clock OCLK as a column clock CCLK, that is used to transfer a read command, a write command, and a column address, among the internal clocks in response to the active command ACT and not to transfer the external clock OCLK as the column clock CCLK in response to the precharge command PCG.

The clock transfer circuit is described hereinafter with reference to FIG. 2.

The clock transfer unit 210 receives the external clock OCLK and transfers one or more internal clocks RCLK and CCLK. Here, the clock transfer unit 210 inverts or does not invert the external clock OCLK to transfer the internal clocks RCLK and CCLK. The internal clocks RCLK and CCLK include a row clock RCLK and a column clock CCLK. The clock transfer unit 210 may be a clock buffer circuit or a clock driver circuit as described with reference to FIG. 1.

The clock transfer unit 210 transfers the external clock OCLK as the column clock CCLK in a period when a control signal CON is activated. Here, the clock transfer unit 210 transfers the external clock OCLK as the row clock RCLK regardless of the control signal CON. The row clock RCLK is a clock that is applied to a circuit (now shown) that performs a row operation, such as a circuit for generating or delaying the active command ACT, the precharge command PCG, and the refresh command and a circuit for generating and delaying a signal used for performing a precharge operation and a refresh operation.

The clock control unit 220 may be an RS latch (not shown) that receives the active command ACT as a set input and the precharge command PCG as a reset input to output the control signal CON. When the clock control unit 220 is an RS latch and the active command ACT of a high pulse is applied as a set input, the control signal CON is activated to a logic high level. When the precharge command PCG of a high pulse is applied as a reset input, the control signal CON is deactivated to a logic low level. However, the structure of the clock control unit 220 is not limited to the RS latch, and any circuit that may perform the above-described operation may be the clock control unit 220.

Here, a column operation refers to such operations as an operation of generating and delaying a read command, a write command, and a column address and an operation of generating and delaying a signal used to perform a data write operation and a data read operation. The delay amount of the read command, the write command, and the column address corresponds to a latency value. Latency represents a standby or delay time from a time when a request of a semiconductor device A to a semiconductor device B to perform a certain operation for cooperation between the semiconductor device A and the semiconductor device B is made to a time when the requested operation of the semiconductor device B is initiated in response to the request. The latency may include a write latency WL, which is a latency corresponding to a time from a moment when the write command is applied to a moment when a write data is inputted from the outside, and an additive latency AL, which is an additional latency for a post-CAS operation.

The clock transfer unit 210 transfers the external clock OCLK as the row clock RCLK to a row operation circuit (not shown in FIG. 2) regardless of the control signal CON. When the control signal CON is activated, the clock transfer unit 210 transfers the external clock OCLK as the column clock CCLK to a column operation circuit (not shown in FIG. 2). Therefore, the operation current (which is a current flowing through the inside of a signal transfer circuit or the inside of a semiconductor device including a signal transfer circuit) in a column operation period becomes a current generated by the supply of the row clock RCLK and the column clock CCLK. In other periods, the operation current becomes a current generated by the supply of the row clock RCLK. Therefore, the operation current is decreased in the periods other than the column operation period, and this leads to a decrease in the power consumption of the semiconductor device including the signal transfer circuit.

Hereinafter, a signal transfer circuit in accordance with another exemplary embodiment of the present invention is described with reference to FIG. 2.

Referring to FIG. 2, the signal transfer circuit includes a clock transfer unit 210 and a clock control unit 220. The clock transfer unit 210 receives an external clock OCLK and transfers the external clock OCLK as one or more internal clocks RCLK and CCLK. The clock control unit 220 controls the clock transfer unit 210 to transfer the external clock OCLK as the column clock CCLK to a circuit that performs a column operation in response to an active command ACT and controls the clock transfer unit 210 not to transfer the external clock OCLK as the column clock CCLK in response to a precharge command PCG.

Here, when the signal transfer circuit shown in FIG. 2 is included in a semiconductor memory device, the circuit that performs a column operation is a circuit that generates and delays a signal for performing a data write operation or a data read operation of the semiconductor memory device. For example, the circuit that performs a column operation may be a circuit that performs the operation of generating or delaying a read command, a write command, and a column address, and the operation of generating and delaying a signal used to perform a data write operation and a data read operation.

Hereinafter, the description on the operation of the signal transfer circuit is the same as described with reference to FIG. 2.

Figure 3:
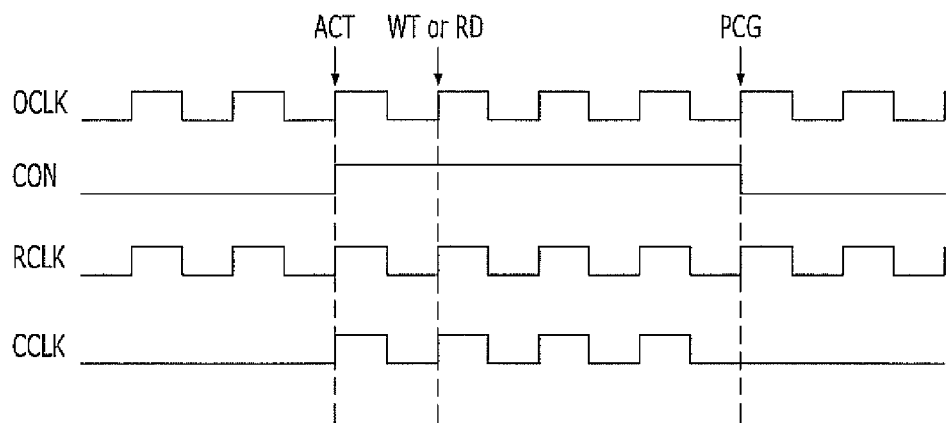
FIG. 3 is a waveform diagram illustrating an operation of the clock transfer circuit shown in FIG. 2.

FIG. 3 is a waveform diagram illustrating an operation of the clock transfer circuit shown in FIG. 2.

Referring to FIG. 3, the clock transfer unit 210 transfers the external clock OCLK as one or more internal clocks RCLK and CCLK. The clock transfer unit 210 transfers the external clock OCLK as the column clock CCLK in a period when a control signal CON is activated and transfers the external clock OCLK as the row clock RCLK regardless of the control signal CON.

The control signal CON is generated by the clock control unit 220. The control signal CON is activated to a logic high level in response to the active command ACT, and the control signal CON is deactivated to a logic low level in response to the precharge command PCG. A write command WT or a read command RD may be applied at a moment one clock behind a moment when the active command ACT is applied.

Figure 4:
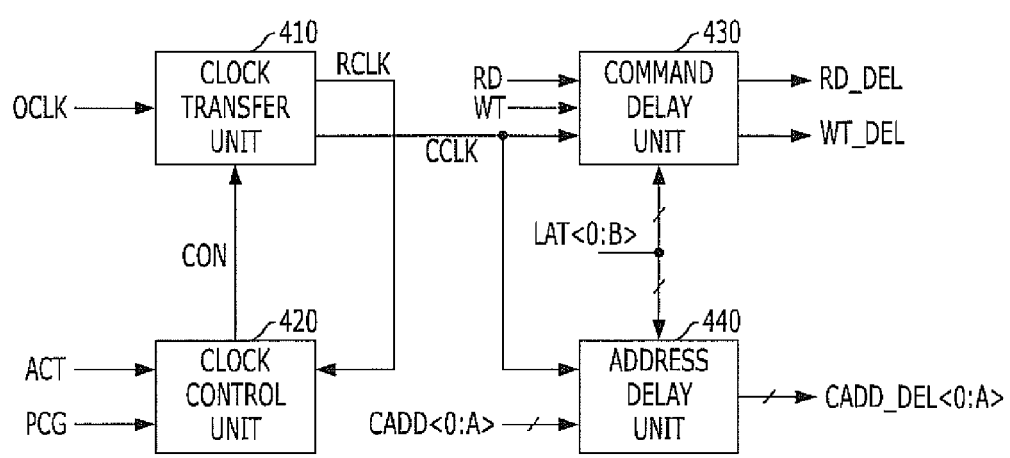
FIG. 4 is a block diagram illustrating a semiconductor device in accordance with an exemplary embodiment of the present invention.
Figure 5:
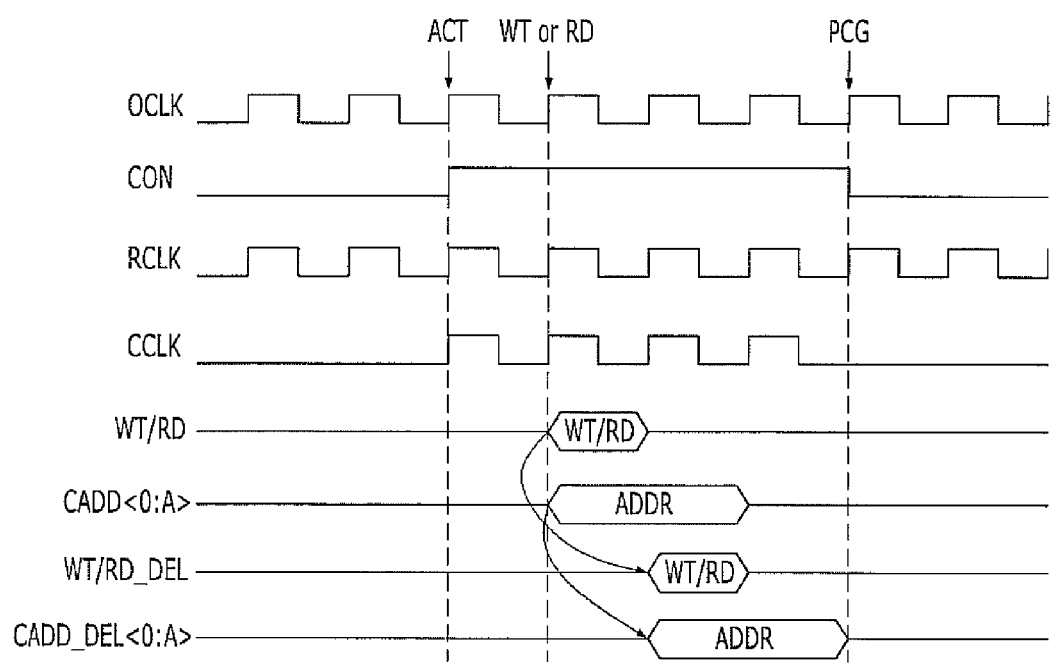
FIG. 5 is a waveform diagram illustrating an operation of the semiconductor device shown in FIG. 4.

FIG. 4 is a block view illustrating a semiconductor device in accordance with an exemplary embodiment of the present invention, and FIG. 5 is a waveform diagram illustrating an operation of the semiconductor device shown in FIG. 4. Here, the semiconductor device shown in FIG. 4 includes the clock transfer circuit shown in FIG. 2.

Referring to FIG. 4, the semiconductor device includes a clock transfer unit 410, a clock control unit 420, a command delay unit 430, and an address delay unit 440. The clock transfer unit 410 receives the external clock OCLK and transfers the received external clock OCLK as one or more internal clocks RCLK and CCLK. The clock control unit 420 controls the clock transfer unit 410 to transfer the external clock OCLK as a column clock CCLK in response to an active command ACT and controls the clock transfer unit 410 not to transfer the external clock OCLK as a column clock CCLK in response to a precharge command PCG. The command delay unit 430 delays a read command RD or a write command WT by using the column clock CCLK. The address delay unit 440 delays a column address CADD<0:A> that is inputted along with the read command RD or the write command WT by using the column clock CCLK.

Hereinafter, an operation of the semiconductor device is described with reference to FIG. 5.

The structures and operations of the clock transfer unit 410 and the clock control unit 420 are the same as the structures and operations of the clock transfer unit 210 and the clock control unit 220 shown in FIG. 2.

Therefore, the clock transfer unit 410 transfers the external clock OCLK as the column clock CCLK in a period when a control signal CON is activated and transfers the external clock OCLK as the row clock RCLK regardless of the control signal CON. Here, the clock transfer unit 410 transfers the row clock RCLK and the column clock CCLK by inverting the external clock OCLK or not.

Also, the clock control unit 420 activates the control signal CON in response to the active command ACT and deactivates the control signal CON in response to the precharge command PCG to transfer the external clock OCLK as the column clock CCLK in a period from a moment when the active command ACT is applied to a moment when the precharge command PCG is applied.

The command delay unit 430 may be one of the circuits that performs a column operation. The command delay unit 430 delays the read command RD or the write command WT and thereby generates a delayed read command RD_DEL or a delayed write command WT_DEL in synchronization with the column clock CCLK. Here, the delay amount of the read command RD or the write command WT corresponds to a latency that is determined in response to latency information LAT<0:B>, which is a digital code of more than one bit. The description on the latency is the same as described with reference to FIG. 2. For the operation, the command delay unit 430 may include a plurality of typical shifting circuits, for example, D-flipflops, that delay a read command RD or a write command WT in synchronization with a column clock CCLK. The latency information LAT<0:B> may be a value which is set and stored in a Mode Register Set (MRS) of the semiconductor device.

The address delay unit 440 may one of the circuits that perform a column operation. The address delay unit 440 delays the column address CADD<0:A> applied along with the read command RD or the write command WT and thereby generates a delayed column address CADD_DEL<0:A> in synchronization with the column clock CCLK. The column address CADD<0:A> is a digital code of more than one bit and represents the column address of a memory cell which a data is to be written or read to/from. Here, the delay amount of the column address CADD<0:A> corresponds to a latency that is determined in response to the latency information LAT<0:B>. For the operation, the address delay unit 440 may include a plurality of typical shifting circuits, for example, D-flipflops, that delay a column address in synchronization with a column clock.

The semiconductor device in accordance with the exemplary embodiment of the present invention may have a decreased amount of operation current and furthermore have reduced power consumption by blocking the supply of the column clock CCLK to the command delay unit 430 and the address delay unit 440 in a period other than a column operation period.

A clock transfer circuit in accordance with an exemplary embodiment of the present invention applies a column clock to a circuit that performs a column operation in a period from a moment when an active command is applied to a moment when a precharge command is applied. Accordingly, the amount of operation current may be decreased in periods other than a column operation period.

Also, since the amount of operation current is decreased in the periods other than a column operation period, the power consumption of the semiconductor device may be reduced.

While the present invention has been described with respect to the specific embodiments, it will be apparent to those skilled in the art that various changes and modifications may be made without departing from the spirit and scope of the invention as defined in the following claims.

What is claimed is:

1. A clock transfer circuit, comprising:
    a clock transfer unit configured to receive an external clock and transfer the received external clock as one or more internal clocks; and
    a clock control unit configured to control the clock transfer unit to transfer the external clock as a column clock among the internal clocks in response to an active command and block a transfer of the external clock as the column clock in response to a precharge command.

2. The clock transfer circuit of claim 1, wherein the clock control unit is configured to generate a control signal that is activated in response to the active command and deactivated in response to the precharge command.

3. The clock transfer circuit of claim 2, wherein the clock transfer unit is configured to transfer the external clock as the column clock in a period when the control signal is activated.

4. The clock transfer circuit of claim 1, wherein the column clock is used to delay a read command, a write command, and a column address.

5. The clock transfer circuit of claim 4, wherein the read command, the write command, and the column address are delayed by a delay amount corresponding to a latency in synchronization with the column clock.

6. The clock transfer circuit of claim 5, wherein the latency comprises a write latency and an additive latency.

7. The clock transfer circuit of claim 1, wherein the internal clocks comprise a row clock that is used to transfer the active command, the precharge command, and a refresh command.

8. The clock transfer circuit of claim 7, wherein the clock transfer unit is configured to transfer the external clock as the row clock regardless of the control signal.

9. A semiconductor device, comprising:
- a clock transfer unit configured to receive an external clock and transfer the received external clock as one or more internal clocks;
- a clock control unit configured to control the clock transfer unit to transfer the external clock as a column clock of the internal clocks in response to an active command and block a transfer of the external clock as the column clock in response to a precharge command; and
- a command delay unit configured to delay a read command or a write command by using the column clock and a latency.

10. The semiconductor device of claim 9, wherein the clock control unit is configured to generate a control signal that is activated in response to the active command and deactivated in response to the precharge command.

11. The semiconductor device of claim 10, wherein the clock transfer unit is configured to transfer the external clock as the column clock in a period when the control signal is activated.

12. The semiconductor device of claim 9, further comprising:
- an address delay unit configured to delay a column address which is inputted along with the read command or the write command by using the column clock and the latency.

13. The semiconductor device of claim 12, wherein the read command, the write command, and the column address are delayed by a delay amount corresponding to the latency in synchronization with the column clock.

14. The semiconductor device of claim 9, wherein the internal clocks comprise a row clock that is used to transfer the active command, the precharge command, and a refresh command.

15. The semiconductor device of claim 14, wherein the clock transfer unit is configured to transfer the external clock as the row clock regardless of the control signal.

16. A signal transfer circuit comprising:
- a clock transfer unit configured to transfer an external clock as one or more internal clocks in response to a control signal; and
- a clock control unit configured to generate the control signal activated in response to an active command and deactivated in response to a precharge command,
- wherein the clock transfer unit is configured to transfer the external clock as a column clock of the internal clocks during an activated period of the control signal.

* * * * *